United States Patent
Lee et al.

(10) Patent No.: US 7,227,267 B2
(45) Date of Patent: Jun. 5, 2007

(54) SEMICONDUCTOR PACKAGE USING FLIP-CHIP MOUNTING TECHNIQUE

(75) Inventors: Yeong Gyu Lee, Gyeonggi-do (KR); Jong Hyeong Song, Gyeonggi-do (KR); Sang Kyeong Yun, Gyeonggi-do (KR); Heung Woo Park, Seoul (KR); Chang Su Park, Gyeonggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 11/245,413

(22) Filed: Oct. 6, 2005

(65) Prior Publication Data

US 2006/0076692 A1    Apr. 13, 2006

(30) Foreign Application Priority Data

Oct. 11, 2004  (KR) ...................... 10-2004-0080877

(51) Int. Cl.
*H01L 23/48* (2006.01)
(52) U.S. Cl. .................... 257/778; 257/783; 257/786
(58) Field of Classification Search ...................... None
See application file for complete search history.

(56) References Cited

U.S. PATENT DOCUMENTS 6,064,120 A * 5/2000 Cobbley et al. ............ 257/780

6,878,435 B2 * 4/2005 Paik et al. ................... 428/215

FOREIGN PATENT DOCUMENTS

KR    10-039314 A    1/2001

* cited by examiner

*Primary Examiner*—Leonardo Andújar
(74) *Attorney, Agent, or Firm*—Christensen O'Connor Johnson Kindness PLLC

(57) ABSTRACT

A semiconductor package using flip-chip mounting technique is disclosed. The semiconductor package includes: a semiconductor device provided with a plurality of first pads extending from the semiconductor device; a substrate provided with a plurality of second pads extending from the substrate at positions in registry with the location of the first pads of the semiconductor device; and an anisotropic conductive material interposed between the plurality of first pads and the plurality of second pads to electrically connect the first pads to associated second pads, the anisotropic conductive material positioned at discrete locations around the semiconductor device, thereby providing unobstructed clearance at desired locations between the semiconductor device and the substrate.

3 Claims, 2 Drawing Sheets

SEMICONDUCTOR PACKAGE USING FLIP-CHIP MOUNTING TECHNIQUE

BACKGROUND OF THE INVENTION

1. Field of the Invention

The present invention relates, in general, to semiconductor packages using flip-chip mounting techniques and, more particularly, to a semiconductor package in which a semiconductor device is mounted using both a flip-chip mounting technique and an anisotropic conductive material.

2. Description of the Related Art

In recent years, micromachining techniques, for producing micro-optical elements, micro-optical sensors, micro-bio-chips, and micro-radio-communication devices, such as micro-mirrors, micro-lenses and micro-switches, using semiconductor device manufacturing processes, have been actively studied.

To use semiconductor devices, manufactured through the micromachining techniques, in practical applications, semiconductor packages must be manufactured.

Semiconductor packaging techniques are complex techniques which include a variety of steps for producing the semiconductor devices and the final products. In recent years, semiconductor packaging techniques have been quickly and highly developed such that one million or more cells can be integrated in a package. Particularly, non-memory semiconductor devices are highly developed such that the devices have a great number of I/O pins, a large die size, a great heat dissipation capacity, highly improved electrical functions, etc. However, the conventional semiconductor packaging techniques for packaging the non-memory semiconductor devices cannot keep pace with the rapid development of semiconductor devices.

The semiconductor packaging techniques are very important techniques which determine the operational performance, sizes, costs and operational reliability of final electronic products. Particularly, the semiconductor packaging techniques play a key role in the manufacture of recently developed electronic products which aim for high electronic performances, smallness/high density, low power consumption, multifunctionality, ultrahigh signal processing rates and permanent operational reliability of the products.

To meet the above-mentioned recent trends, a flip-chip bonding technique, which is a kind of technique for electrically connecting a semiconductor chip to a substrate, has been actively studied, proposed and used. However, a conventional flip-chip bonding technique must execute complicated bonding processes using solder, which include applying solder flux onto a substrate, arranging a chip having solder bumps relative to the substrate having surface electrodes, executing the reflow of solder bumps, removing remaining flux, and applying and hardening underfill, thus increasing the costs of final products.

Therefore, in an effort to simplify the complicated processes of the conventional flip-chip bonding techniques, a wafer-phase semiconductor packaging technique, in which a polymer material, functioning as both flux and underfill, is applied to a semiconductor wafer, has been actively studied and developed. Furthermore, a flip-chip bonding technique using a conductive adhesive, which is advantageous in that it can reduce production costs, provide microelectrode pitches, and can be environment-friendly because it does not use flux or lead, and in which processes are executed at low temperatures, has been actively studied and developed.

Conventional conductive material layers are classified into two types: anisotropic conductive material layers and isotropic conductive material layers. A conductive material layer comprises conductive particles, such as Ni, Au/polymer, or Ag particles, and a base resin, such as a thermosetting resin, thermoplastic resin, or blend type insulating resin produced by mixing the properties of the thermosetting resin and the thermoplastic resin.

FIG. 1A is a sectional view illustrating a conventional anisotropic conductive film. As shown in FIG. 1A, the conventional anisotropic conductive film 10 is a polymer resin-based film, with conductive particles 20 finely dispersed in the conductive film 10 to impart conductivity to the film. A releasing film 30 is attached to each surface of the anisotropic conductive film 10.

FIG. 1B is a sectional view illustrating a conventional flip-chip bonding technique for producing a semiconductor package using the anisotropic conductive film of FIG. 1A. As shown in the drawing, a first release film 30 is removed from one surface of the anisotropic conductive film 10 and the exposed surface of the anisotropic conductive film 10 is thermally compressed and adhered to a substrate 50. Thereafter, a second release film 30 is removed from the other surface of the anisotropic conductive film 10. An IC chip 40 having bumps 45 is placed on the exposed surface of the conductive film 10 such that the bumps 45 of the IC chip 40 are aligned with electrodes 55 of the substrate 50. Thereafter, the anisotropic conductive film 10, having the IC chip 40 and the substrate 50, is subjected to thermal compression, so that the conductive particles in the anisotropic conductive film are plastically deformed, thus mechanically and electrically coupling the bumps 45 to the electrodes 55.

However, to use the flip-chip bonding technique, which can produce semiconductor packages using anisotropic conductive films, in the process of producing a semiconductor device using a micromachining technique, it is required to solve some technical problems in advance.

SUMMARY OF THE INVENTION

Accordingly, the present invention has been made keeping in mind the above-mentioned requirements occurring in the related art, and an object of the present invention is to provide a semiconductor package which is manufactured using a flip-chip mounting technique capable of providing a reliable electrical connection between a semiconductor substrate and a transparent substrate.

Another object of the present invention is to provide a semiconductor package which is manufactured using a flip-chip mounting technique capable of providing a desired joining strength between the semiconductor substrate and the transparent substrate even when a low temperature and a low compression load are used in the process of joining the semiconductor substrate to the transparent substrate.

In order to achieve the above objects, there is provided a semiconductor package using flip-chip mounting technique, comprising: a semiconductor device provided with a plurality of first pads extending from the semiconductor device; a substrate provided with a plurality of second pads extending from the substrate at positions in registry with the location of the first pads of the semiconductor device; and an anisotropic conductive material interposed between the plurality of first pads and the plurality of second pads to electrically connect the first pads to associated second pads, the anisotropic conductive material positioned at discrete locations around the semiconductor device, thereby providing unobstructed clearance at desired locations between the semiconductor device and the substrate.

The semiconductor package using flip-chip mounting technique according to the present invention preferably further comprises a plurality of bumps provided on the first pads of the semiconductor device, each of the bumps extending in the direction of a corresponding second pad.

In the semiconductor package using flip-chip mounting technique according to the present invention, the substrate is preferably transparent to light. The transparent substrate is preferably provided with an anti-reflective coating on at least one of the surfaces thereof, thus increasing light transmissivity of incident light.

BRIEF DESCRIPTION OF THE DRAWINGS

The above and other objects, features and other advantages of the present invention will be more clearly understood from the following detailed description when taken in conjunction with the accompanying drawings, in which:

FIG. 1B is a sectional view illustrating a conventional flip-chip bonding technique for producing a semiconductor package using the anisotropic conductive film of FIG. 1a;

DETAILED DESCRIPTION OF THE INVENTION

Herein below, a semiconductor package manufactured using a flip-chip mounting technique according to the present invention will be described in detail with reference to the accompanying drawings.

Figure 1A:
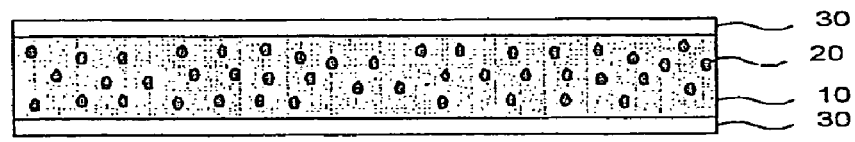
FIG. 1A is a sectional view illustrating a conventional anisotropic conductive film.
Figure 1B:
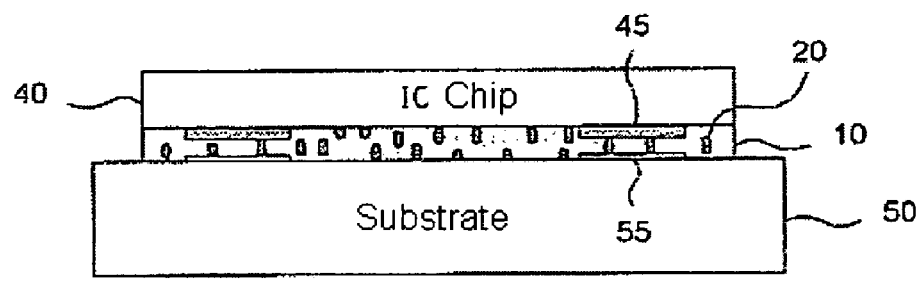
Figure 2:
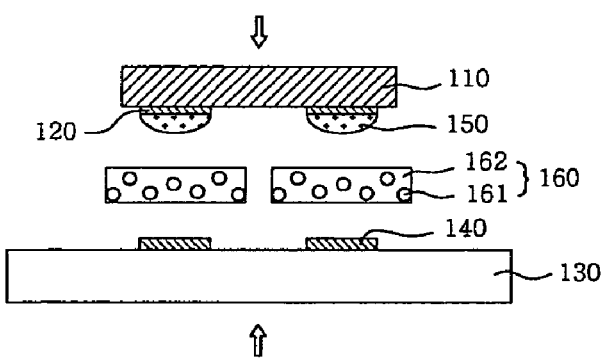
FIG. 2 is a sectional view of a semiconductor package manufactured using a flip-chip mounting technique according to an embodiment of the present invention.
Figure 2:
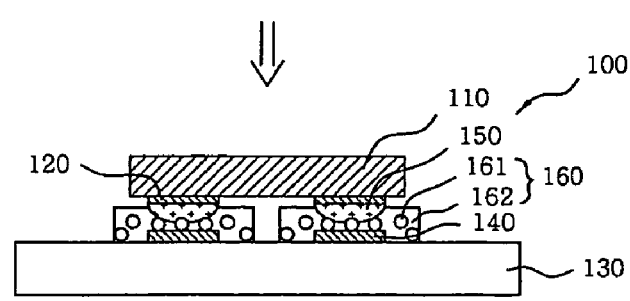

FIG. 2 is a sectional view of a semiconductor package manufactured using a flip-chip mounting technique according to an embodiment of the present invention.

As shown in FIG. 2, the semiconductor package 100 manufactured using the flip-chip mounting technique according to the present invention comprises a semiconductor substrate 110 provided with a plurality of upper pads 120 on a lower surface thereof, a transparent substrate 130 provided with a plurality of lower pads 140 on an upper surface thereof, and an anisotropic conductive material layer 160 interposed between each of the upper pads 120 and an associated lower pad 140. The semiconductor package 100 manufactured using the flip-chip mounting technique according to the present invention preferably further comprises a bump 150 that is provided on each of the upper pads 120. The bump 150 extends in the direction of a corresponding lower pad 140. Furthermore, the semiconductor package 100 of the present invention may further comprise a bump (not shown) that is provided on each of the lower pads 140 of the transparent substrate 130. This bump extends in the direction of a corresponding upper pad 120.

The semiconductor substrate 110 is integrated with micro-machines, such as micro-optical elements, micro-optical sensors, micro-bio-chips, and micro-radio-communication devices. For example, light modulators may be integrated in the lower surface of the semiconductor substrate 110.

Furthermore, because the semiconductor substrate 110 is provided with the plurality of upper pads 120 on the lower surface thereof, the semiconductor substrate 110 can receive control signals or electric signals through the upper pads 120.

The transparent substrate 130 is formed of an optically transparent material so that incident light can be transmitted through the transparent substrate 130. To enhance the light transmissivity of the transparent substrate 130, it is preferable to form an anti-reflective coating on at least one of opposite surfaces of the transparent substrate 130.

Furthermore, because the transparent substrate 130 is provide with the plurality of lower pads 140 on the upper surface thereof, the transparent substrate 130 can transmit control signals or electric signals to the semiconductor substrate 110 through the lower pads 140, thus controlling the micro-machines integrated in the semiconductor substrate 110.

The bumps 150 are respectively formed on the upper pads 120 of the semiconductor substrate 110 and transmit the electric signals between the semiconductor substrate 110 and the transparent substrate 130.

In accordance with another embodiment of the present invention, micro-electro-mechanical systems (MEMS) may be integrated in the lower surface of the semiconductor substrate 110. In the above case, the semiconductor package preferably requires a space defined therein to allow the MEMS to be actuated in the space. The bumps 150 preferably act as spacers to create the space in the semiconductor package.

The anisotropic conductive material layers 160 are configured such that conductive particles 161, such as metal-coated plastic particles or metal particles, are dispersed in an adhesive, such as epoxy.

In the embodiment of the present invention, the anisotropic conductive material layers 160 are processed as follows to electrically connect the upper pads 120 to the lower pads 140. The anisotropic conductive material layers 160 are primarily placed between the upper pads 120 of the semiconductor substrate 110 and the lower pads 140 of the transparent substrate 130, and then heated at a low temperature and compressed with a low compression load. Thus, the conductive particles 161 dispersed in the anisotropic conductive material layers 160 are brought into close contact with the upper and lower pads 120 and 140, thereby electrically connecting the upper pads 120 to the associated lower pads 140. In the above case, parts of the anisotropic conductive material layers 160 located on uncompressed parts of the upper and lower pads 120 and 140 are not electrically connected to each other because the conductive particles 161 in the designated parts are spaced apart from each other.

Therefore, in the semiconductor package 100 manufactured using a flip-chip mounting technique according to the present invention, the upper pads 120 of the semiconductor substrate 110 can be electrically connected to the lower pads 140 of the transparent substrate 130 using a low compression load at a low temperature. Thus, the upper pads 120 are electrically connected to the lower pads 140 through a thermal compression process using a low compression load that does not cause cracks in the transparent substrate 130.

In a preferred embodiment of the present invention, an anisotropic conductive film, processed such that part of the film to be brought into close contact with the upper pads 120 and the lower pads 140, 241, 242 and 243 remains, may be used as the anisotropic conductive material layer 160.

In another preferred embodiment of the present invention, an anisotropic conductive solution, prepared by mixing conductive particles 161, such as metal-coated plastic particles or metal particles, with an adhesive 162, such as epoxy, may be used as the anisotropic conductive material layer 160. In the above case, the anisotropic conductive material layer 160 may be formed by shallowly dipping the upper pads 120 of the semiconductor substrate 110 (or the bumps 150 in the case of upper pads 120 having the bumps 150) in the anisotropic conductive solution. Alternatively, the anisotropic conductive material layer 160 may be formed by lightly stamping the upper pads 120 of the semiconductor substrate 110 (or the bumps 150 in the case of upper pads 120 having the bumps 150) onto a fabric laden with the anisotropic conductive solution.

Figure 3:
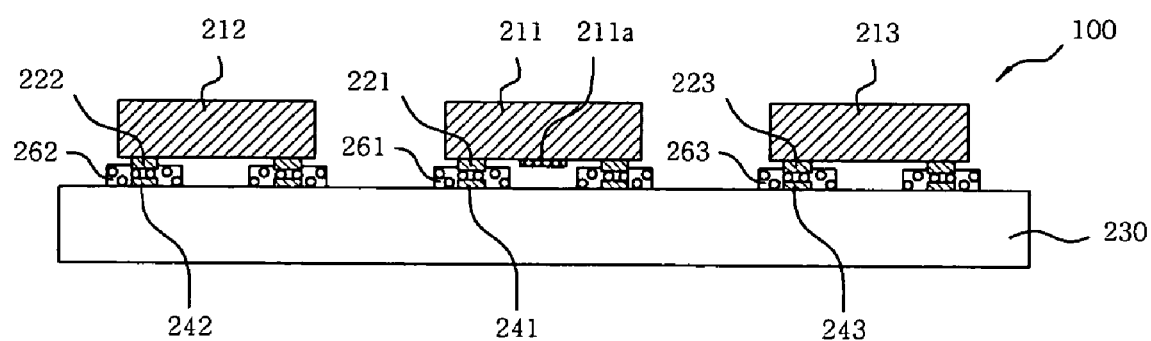
FIG. 3 is a sectional view of a light modulator module package manufactured according to the present invention.

FIG. 3 is a sectional view illustrating a light modulator module package manufactured according to the present invention.

As shown in FIG. 3, the light modulator module package 200 manufactured according to the present invention includes a transparent substrate 230, a light modulator device 211, and a plurality of drive integrated circuits 212 and 213.

The transparent substrate 230 is formed of an optically transparent material so that incident light can be transmitted through the substrate 230. The light modulator device 211, the plurality of drive integrated circuits 212 and 213, and a plurality of lower pads 241, 242 and 243 to transceive electrical signals are formed on the surface of the transparent substrate 230.

The light modulator device 211 is a semiconductor device integrated with a refractive, reflective or transmissive light modulator 211a on the lower surface thereof. The light modulator device 211 modulates the incident light passing through the transparent substrate 230, and then emits the modulated light to the outside. The light modulator device 211 is provided with a plurality of upper pads 221 on the lower surface thereof. The upper pads 221 of the light modulator device 211 are electrically connected to the associated lower pads 241 of the transparent substrate 230 by means of anisotropic conductive material layers 261.

The plurality of drive integrated circuits 212 and 213 are placed around the light modulator device 211 and provide drive voltage to drive the light modulator device 211. In a manner similar to the light modulator device 211, the drive integrated circuits 212 and 213 are each provided with a plurality of upper pads 222 or 223 on the lower surface thereof. The upper pads 222 and 223 of the drive integrated circuits 212 and 213 are electrically connected to the associated lower pads 242 and 243 of the transparent substrate 230 through anisotropic conductive material layers 262 and 263.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As described above, the present invention provides a semiconductor package manufactured using a flip-chip mounting technique. In the semiconductor package according to the present invention, a reliable electrical connection between a plurality of upper pads of a semiconductor substrate and a plurality of lower pads of a transparent substrate can be accomplished through a thermal compression process using a low compression load at a low temperature.

To produce the semiconductor package using the flip-chip mounting technique according to the present invention, a thermal compression process using a low compression load is executed so that the transparent substrate does not crack.

Furthermore, in the semiconductor package using the flip-chip mounting technique according to the present invention, the electrical connection of the upper pads of the semiconductor substrate to the lower pads of the transparent substrate is easily accomplished, so that the process of manufacturing the semiconductor package is simplified, and accomplishes the recent trend of hyperfineness, high-functionality, smallness and compactness of semiconductor packages.

What is claimed is:

1. A semiconductor package using flip-chip mounting technique, comprising:
   a semiconductor device provided with a plurality of first pads extending from the semiconductor device;
   a substrate provided with a plurality of second pads extending from the substrate at positions in registry with the location of the first pads of the semiconductor device; and
   an anisotropic conductive material interposed between the plurality of first pads and the plurality of second pads to electrically connect the first pads to associated second pads, the anisotropic conductive material positioned at discrete locations around the semiconductor device, thereby providing unobstructed clearance at desired locations between the semiconductor device and the substrate; and
   wherein the semiconductor device comprises an optical modulating device and the substrate is transparent to light, so that light is transmitted through the transparent substrate and is incident on the optical modulating device, and is reflected from the optical modulating device to be output through the transparent substrate.

2. The semiconductor package according to claim 1, wherein the light travels to and from the optical modulating device through the unobstructed clearance provided between the optical modulating device and the transparent substrate due to positioning of the anisotropic conductive material at discrete locations around the semiconductor device.

3. The semiconductor package according to claim 1, wherein an anti-reflective coating is disposed on at least one of the surfaces of the transparent substrate to increase light transmissivity of incident light.

* * * * *